United States Patent
Kim et al.

(10) Patent No.: US 10,529,905 B2
(45) Date of Patent: Jan. 7, 2020

(54) METHOD FOR MANUFACTURING THERMOELECTRIC MATERIAL HAVING HIGH EFFICIENCY

(71) Applicant: KOREA INSTITUTE OF SCIENCE AND TECHNOLOGY, Seoul (KR)

(72) Inventors: Jin-Sang Kim, Seoul (KR); Seung-Hyub Baek, Seoul (KR); Seong-Keun Kim, Seoul (KR); Dow-Bin Hyun, Seoul (KR); Beomjin Kwon, Seoul (KR); Ji-Won Choi, Seoul (KR); Chong-Yun Kang, Seoul (KR); Im-Jun Roh, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 120 days.

(21) Appl. No.: 15/609,057

(22) Filed: May 31, 2017

(65) Prior Publication Data
US 2018/0138386 A1    May 17, 2018

(30) Foreign Application Priority Data

Nov. 16, 2016    (KR) .................. 10-2016-0152812

(51) Int. Cl.
| | | |
|---|---|---|
| H05B 3/00 | (2006.01) | |
| H01L 35/34 | (2006.01) | |
| H01L 35/16 | (2006.01) | |
| B28B 3/20 | (2006.01) | |
| B28B 11/16 | (2006.01) | |
| B28B 11/24 | (2006.01) | |
| B28B 17/00 | (2006.01) | |

(52) U.S. Cl.
CPC .............. *H01L 35/34* (2013.01); *H01L 35/16* (2013.01); *B28B 3/20* (2013.01); *B28B 11/16* (2013.01); *B28B 11/243* (2013.01); *B28B 17/0009* (2013.01); *Y10T 29/49083* (2015.01)

(58) Field of Classification Search
CPC ........ H01L 2225/06589; H01L 25/0657; F28F 13/00; Y10T 29/49083; Y10T 137/1516; B28B 11/16; B28B 3/20; B29C 48/00; B29C 48/0016
USPC ................................ 29/611, 592.1, 613, 619
See application file for complete search history.

(56) References Cited

U.S. PATENT DOCUMENTS

| | | | |
|---|---|---|---|
| 6,313,392 B1 | 11/2001 | Sato et al. | |
| 6,617,504 B2 * | 9/2003 | Kajihara | ................. H01L 35/34 136/201 |

FOREIGN PATENT DOCUMENTS

| | | |
|---|---|---|
| KR | 10-2000-0028741 A | 5/2000 |
| KR | 10-2001-0037126 A | 5/2001 |
| KR | 10-2002-0042519 A | 6/2002 |

\* cited by examiner

*Primary Examiner* — Thiem D Phan
(74) *Attorney, Agent, or Firm* — Rabin & Berdo, P.C.

(57) ABSTRACT

A method for manufacturing a thermoelectric material is provided. According to the method, a first shaped body is formed from a thermoelectric powder, of which a crystal has a layer structure. An extruded body is formed by extruding the first shaped body. A plurality of cut-off pieces are formed by cutting the extruded body along a cross-section perpendicular to an extrusion direction. A second shaped body is formed by stacking and pressing the cut-off pieces along a direction perpendicular to the extrusion direction. According to the above, a thermoelectric ability of a thermoelectric material and an efficiency for manufacturing a thermoelectric module may be improved.

7 Claims, 10 Drawing Sheets

METHOD FOR MANUFACTURING THERMOELECTRIC MATERIAL HAVING HIGH EFFICIENCY

CROSS-REFERENCE TO RELATED APPLICATIONS

This application claims priority under 35 U.S.C. § 119 to Korean Patent Application No. 10-2016-0152812, filed on Nov. 16, 2016, and all the benefits accruing therefrom, the content of which is herein incorporated by reference in its entirety.

BACKGROUND

1. Field

Exemplary embodiments relate to a thermoelectric material. More particularly, exemplary embodiments relate to a method for manufacturing a thermoelectric material having high efficiency and a method for manufacturing a thermoelectric module.

2. Description of the Related Art

A thermoelectric material is an energy-converting material in which an electric energy is generated when a temperature difference is provided to its both ends, and in which a temperature difference occurs between the both ends when electric energy is provided thereto.

A thermoelectric effect may include Seebeck effect, which may be used for thermoelectric generation, and Peltier effect, which may be used for electronic refrigeration. For example, heat that is generated by a computer, an automobile engine or the like may be converted to electric energy by using Seebeck effect. Furthermore, a various refrigeration system without a cooling agent may be embodied by using Peltier effect.

A thermoelectric element using the thermoelectric effect has a simple structure and high stability, and can be easily treated and widely used, for example, for generation using temperature difference, controlling a temperature of a semiconductor laser, cooling a water purifier, cooling a seat of an automobile, manufacturing a small-sized refrigerator or the like. Thus, research and development are being conducted for improving abilities of the thermoelectric element.

Generation efficiency and cooling efficiency of the thermoelectric element formed from the thermoelectric material intimately relate to abilities of the material. For example, Bi—Sb—Te—Se alloy is known as an thermoelectric material that is effective at a near room temperature (253K-573K), and has a thermoelectric figure of merit (ZT) of about 1.

The thermoelectric figure of merit (ZT) is an index that may represent a generation ability, a cooling ability or the like of the thermoelectric material, and may be represented by the following formula.

$ZT = S^2 \sigma / \kappa T$ (S: thermoelectromotive force, $\sigma$: electric conductivity, $\kappa$: thermal conductivity, $T$: absolute temperature)

The thermoelectric material having high thermoelectric figure of merit (ZT) has high energy-conversion efficiency. In order to increase the thermoelectric figure of merit, increasing an electric conductivity and a Seebeck coefficient and decreasing a thermal conductivity are required. Thus, the thermoelectric material is preferred to have a high electric conductivity and a low thermal conductivity.

The above-mentioned Bi—Sb—Te—Se alloy has a layer structure, and a semiconductive material having anisotropic thermoelectric properties due to its crystalline structure. Thus, the thermoelectric figure of merit may be changed depending on orientation of a crystal. Therefore, orientation degree needs to be increased in order to increase abilities of the thermoelectric material.

According to Korean Patent Application Publication No. 10-2000-0028741, a bulk material is firstly extruded for increasing its thermoelectric ability, and then secondly extruded with coinciding orientation of the firstly extruded material to further increase orientation of the material. According to the method, the orientation of the material depends on extrusion ratio, which is a size of a discharged area with respect to a size of an input area of an extrusion die. Thus, a size of a finally extruded material is too small to obtain an available size for manufacturing a thermoelectric module.

SUMMARY

Exemplary embodiments provide a method for manufacturing a thermoelectric material having high orientation and a size easily available for manufacturing a thermoelectric module.

Exemplary embodiments provide a method for manufacturing a thermoelectric module.

According to an exemplary embodiment, a method for manufacturing a thermoelectric material is provided. According to the method, a first shaped body is formed from a thermoelectric powder, of which a crystal has a layer structure. An extruded body is formed by extruding the first shaped body. A plurality of cut-off pieces are formed by cutting the extruded body along a cross-section perpendicular to an extrusion direction. A second shaped body is formed by stacking and pressing the cut-off pieces along a direction perpendicular to the extrusion direction.

In an exemplary embodiment, the thermoelectric material includes at least one selected from the group consisting of Bi—Te, Sb—Te, Bi—Te—Se, Bi—Te—Sb and Bi—Sb—Te—Se.

In an exemplary embodiment, the extruded body is orientated along a direction parallel with a first crystal plane parallel with the layer structure of the thermoelectric material.

In an exemplary embodiment, the second shaped body is formed under a pressure of 5 MPa to 500 MPa.

In an exemplary embodiment, the cut-off pieces are stacked in a mold to form the second shaped body, and a length of the cut-off pieces is smaller than a width of an inner space of the mold along a longitudinal direction of the cut-off pieces.

In an exemplary embodiment, the second shaped body is sintered.

In an exemplary embodiment, the second shaped body is sintered through a hot press process or a discharging plasma process.

In an exemplary embodiment, the second shaped body is sintered at a temperature of 300° C. to 600° C.

According to an exemplary embodiment, a method for manufacturing a thermoelectric module is provided. According to the method, the thermoelectric material manufactured by the above method is cut along a cross-section perpendicular to the extrusion direction to form a mother material having a plate shape. The mother material is cut along a cross-section parallel with the extrusion direction to form a thermoelectric material unit. Both ends of the thermoelectric material unit are combined with a first substrate and a second substrate, respectively.

In an exemplary embodiment, a metal layer is formed on at least one of an upper surface and a lower surface of the mother material before the mother material is cut.

In an exemplary embodiment, the first substrate includes a first connection line contacting the thermoelectric material unit, and the second substrate includes a second connection line contacting the thermoelectric material unit.

According to the exemplary embodiments, orientation of a thermoelectric material is increased. Thus, a thermoelectric ability of the thermoelectric material may be improved. Furthermore, an efficiency for manufacturing a thermoelectric module may be improved with compared to a conventional method using an extruded body.

BRIEF DESCRIPTION OF THE DRAWINGS

The above and other features and advantages will become more apparent by describing exemplary embodiments thereof with reference to the accompanying drawings, in which.

DETAILED DESCRIPTION

Figure 1:
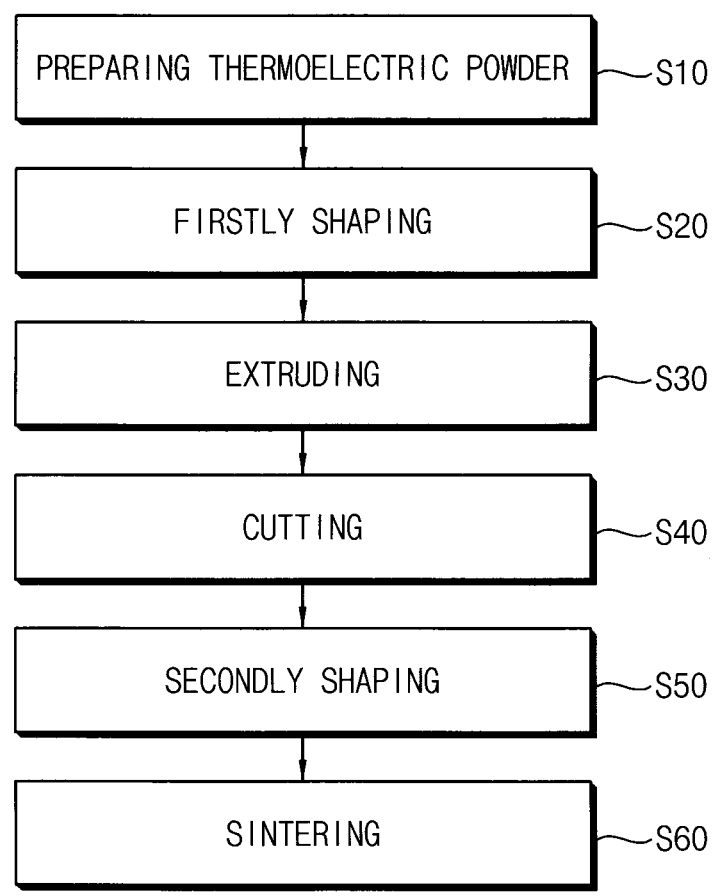
FIG. 1 is a flow chart representing a method for manufacturing a thermoelectric material according to an exemplary embodiment of the present invention.

Example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity. It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
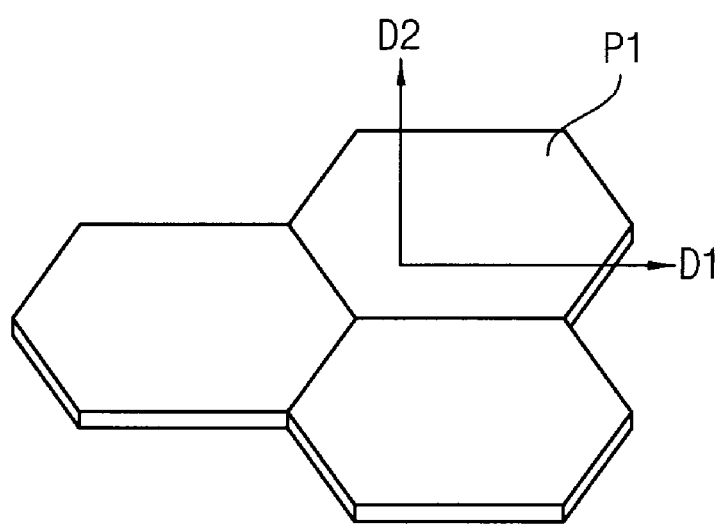
FIG. 2 is a schematic view illustrating anisotropy of a thermoelectric material.
Figure 3:
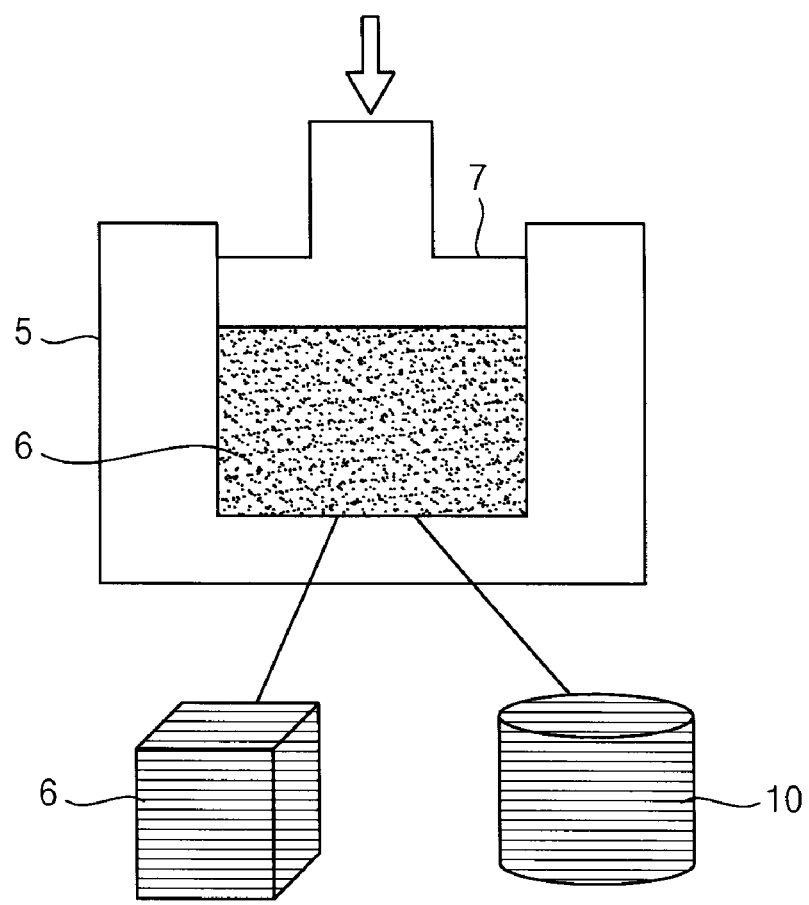
FIG. 3 is a cross-sectional view illustrating a process of preparing a firstly-shaped body in a method for manufacturing a thermoelectric material according to an exemplary embodiment of the present invention.
Figure 4:
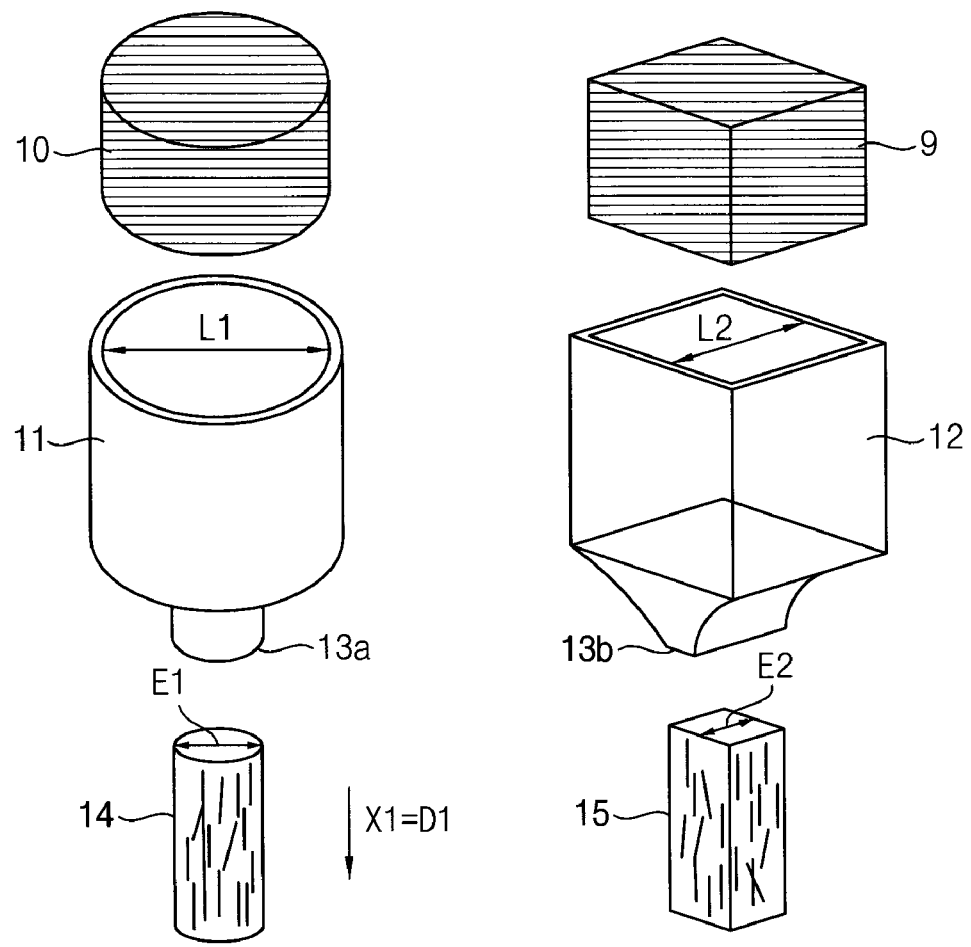
FIG. 4 is a perspective view illustrating an extrusion process in a method for manufacturing a thermoelectric material according to an exemplary embodiment of the present invention.
Figure 5:
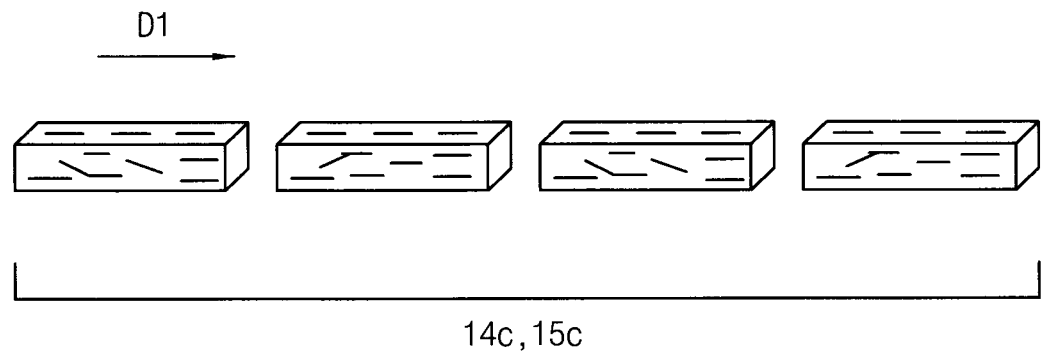
FIG. 5 is a perspective view illustrating a process of cutting an extruded body in a method for manufacturing a thermoelectric material according to an exemplary embodiment of the present invention.
Figure 6:
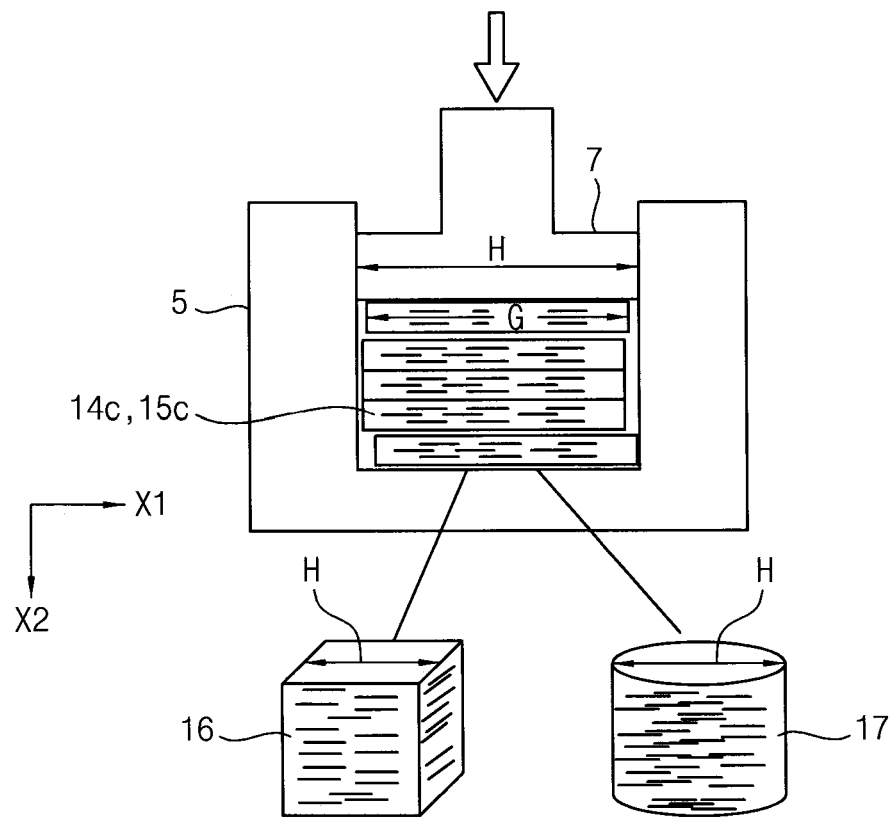
FIG. 6 is a cross-sectional view illustrating a process of preparing a secondly-shaped body in a method for manufacturing a thermoelectric material according to an exemplary embodiment of the present invention.
Figure 7:
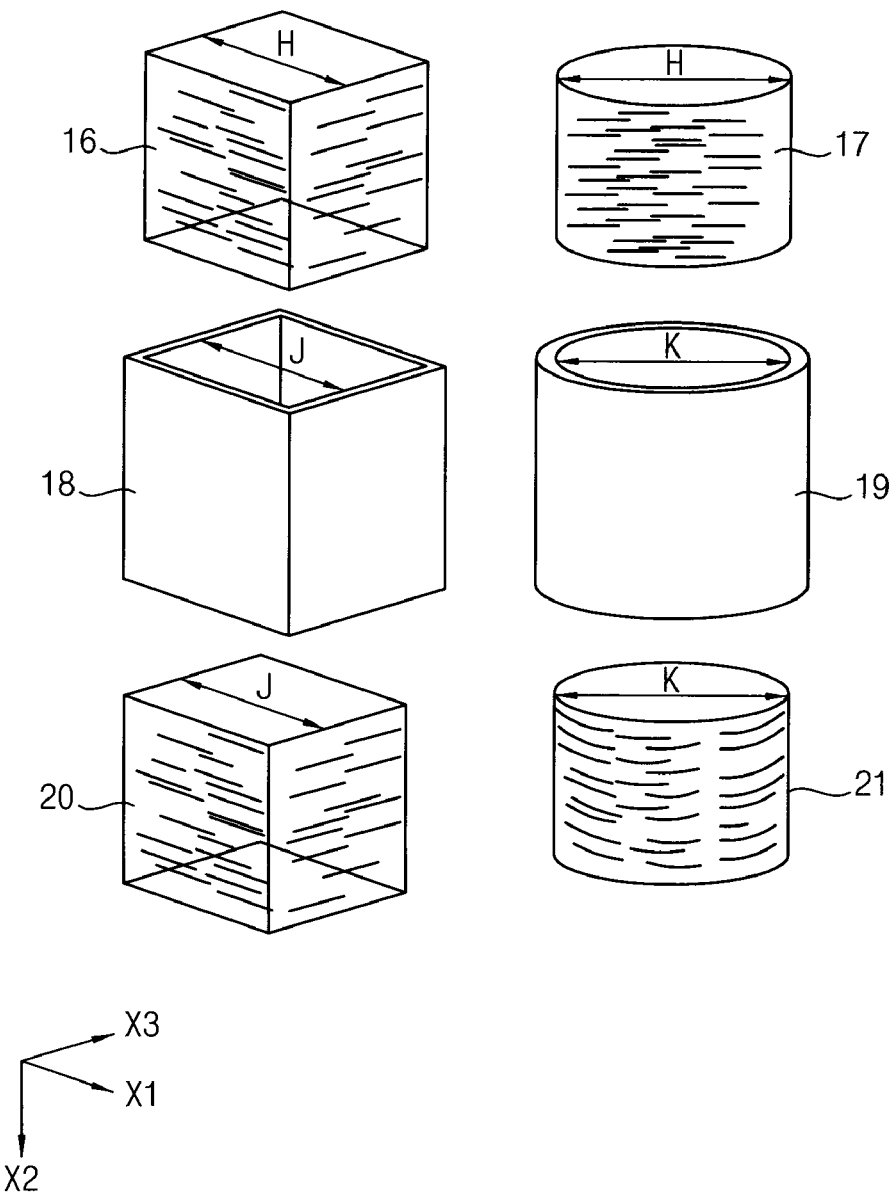
FIG. 7 is a perspective view illustrating a process of sintering a secondly-shaped body in a method for manufacturing a thermoelectric material according to an exemplary embodiment of the present invention.

FIG. 1 is a flow chart representing a method for manufacturing a thermoelectric material according to an exemplary embodiment of the present invention. FIG. 2 is a schematic view illustrating anisotropy of a thermoelectric material. FIG. 3 is a cross-sectional view illustrating a process of preparing a firstly-shaped body in a method for manufacturing a thermoelectric material according to an exemplary embodiment of the present invention. FIG. 4 is a perspective view illustrating an extrusion process in a method for manufacturing a thermoelectric material according to an exemplary embodiment of the present invention. FIG. 5 is a perspective view illustrating a process of cutting an extruded body in a method for manufacturing a thermoelectric material according to an exemplary embodiment of the present invention. FIG. 6 is a cross-sectional view illustrating a process of preparing a secondly-shaped body in a method for manufacturing a thermoelectric material according to an exemplary embodiment of the present invention. FIG. 7 is a perspective view illustrating a process of sintering a secondly-shaped body in a method for manufacturing a thermoelectric material according to an exemplary embodiment of the present invention.

Referring to FIG. 1, a thermoelectric powder is prepared (S10).

The thermoelectric powder may include an N-type thermoelectric material or a P-type thermoelectric material. For example, the thermoelectric powder may include at least one of a bi-component material, a tri-component material and a quad-component material such as bismuth (Bi)-tellurium (Te), antimony (Sb)—Te, Bi—Te-selenium (Se), Bi—Te—Sb, Bi—Sb—Te—Se or the like. For example, Se may be added to Bi—Te to form the N-type thermoelectric material, or Sb may be added to Bi—Te to form the P-type thermoelectric material. Impurities such as $SbI_3$, Cu, Ag, $CuCl_2$ or the like may be added to form an N.P-type thermoelectric material. Furthermore, a material including a crystal having a layer structure and a superior thermoelectric ability at a high temperature as well as a thermoelectric material that is advantageous at a room temperature may be applied.

The thermoelectric powder may be obtained by a conventional method. For example, sources of each components of the thermoelectric powder may be treated by various methods such as ball-milling, mechanical alloying, melt-spinning or the like. A size of the thermoelectric powder may be several nm to hundreds of μm, however, exemplary embodiments of the present invention are not limited thereto.

Referring to FIG. 2, the thermoelectric material of the thermoelectric powder may a plate shape such as a hexagonal tabular shape. Thus, a crystal grain formed therefrom may have a plate shape or a layer shape including an array of a plate shape. Thus, the thermoelectric material may have anisotropy of electrical properties and thermoelectric properties. For example, the thermoelectric material may have a relatively higher thermoelectric ability along a direction D1 parallel with a first crystal plane P1 (ab plane), the direction being parallel with the plate shape. The thermoelectric material may have a relatively lower thermoelectric ability along a direction D2 (c-axis) perpendicular to the first crystal plane P1.

Thereafter, the thermoelectric powder is shaped to form a first shaped body (S20).

For example, as illustrated in FIG. 3, the thermoelectric powder 6 is disposed in a mold 5, and pressed by a press 7 to form a shaped body 9 or 10. The shaped body 9 or 10 may have various shapes such as a quadrangular prism shape, a cylindrical shape or the like, depending on a shape of the mold 5. For example, the shaped body may be designed to have a shape suitable for a shape of an extrusion die used in a following extrusion process.

For example, the first shaped body may be formed in a range of a room temperature, which may be about 20° C. to about 30° C., to 500° C., and may be pressed by 5 MPa to 500 MPa.

Thereafter, the first shaped body is extruded to form an extruded body (S30). The first shaped body may have no orientation or little orientation. The thermoelectric material may be orientated by the extrusion.

For example, the first shaped body may pass through an outlet having a size smaller than a size of a pressed area. Referring to FIG. 4, the shaped body 10 having a cylindrical shape may be put in an extrusion die 11 having a cylindrical shape and pressed to be discharged through the outlet 13a to form an extruded body 14. A diameter L1 of a pressed surface, to which a pressure is provided, of the first shaped body 10 is larger than a diameter E1 of the outlet 13a. The shaped body 9 having a quadrangular prism shape may be put in an extrusion die 12 having a quadrangular prism shape and pressed to be discharged through an outlet 13b to form an extruded body 15. A width L2 of a pressed surface, to which a pressure is provided, of the first shaped body 9 is larger than a width E2 of the outlet 13b. A shape of the extruded body 14 or 15 may be determined depending on a shape of the outlet 13a and 13b. For example, the extruded body 14 or 15 may have a cylindrical shape, quadrangular prism shape or the like.

Orientation anisotropy obtained by the extrusion may depend on an extrusion direction and a crystalline structure of the thermoelectric material. For example, when the thermoelectric material has a crystal grain of a plate shape, the plate shape may be parallel with an extrusion direction X1 so that the first crystal plane P1 becomes parallel with the extrusion direction D1. Thus, the extruded body 14 or 15 may have increased thermoelectric properties along the extrusion direction.

For example, a temperature in the extrusion process may be 300° C. to 600° C., and a discharging speed may be 1 mm to 20 cm per minute.

In the extrusion process, an extrusion ratio, which is defined by an area ratio of an input part to a discharging part in the extrusion die, is an important factor that may determine orientation extent of the extruded material. For example, the extrusion ratio may be 5 to 50. Thus, since a size of the extruded material along a direction perpendicular to the extrusion direction is supposed to be much smaller than a size of a pressing apparatus, it is hard to obtain the extruded material having a large size along a cross-section perpendicular to the extrusion direction. When a thermoelectric module is manufactured, electrodes are supposed to be combined with both ends of the thermoelectric material along the extrusion direction because of anisotropy of thermoelectric properties. Thus, the extruded material having a small size may cause limitation of designing the thermoelectric module. Furthermore, since the number of thermoelectric material units is small, it is hard to increase a manufacturing efficiency for the thermoelectric module.

Thus, following processes may be performed for increasing a size of the extruded body along a direction perpendicular to the extrusion direction, and its orientation.

The extruded body is cut along a cross-section perpendicular to the extrusion direction X1 (S40) to form cut-off pieces 14c or 15c as illustrated in FIG. 5.

The cut-off pieces 14c or 15c are stacked and pressed to form a second shaped body (S50).

Referring to FIG. 6, the cut-off pieces 14c or 15c are stacked along a direction perpendicular to the extrusion direction X1 in a mold 5, and the cut-off pieces 14c or 15c are pressed along the stacked direction by a press 7 to form the second shaped body 16 or 17.

The second shaped body 16 or 17 may have various shapes such as a quadrangular prism shape, a cylindrical shape or the like. The second shaped body 16 or 17 may have orientation along the extrusion direction X1. Furthermore, since the second shaped body 16 or 17 is formed from stack of a plurality of an extruded body, the second shaped body 16 or 17 may have a longer length along the direction X2 perpendicular to the extrusion direction X1 than the individual extruded body 14 or 15. Thus, efficiency of manufacturing a thermoelectric module may be increased.

Preferably, a length G of the cut-off piece 14c or 15c disposed in the mold 5 may be smaller than a diameter or a width H of an inner space of the mold 5 along a longitudinal direction of the cut-off piece 14c or 15c. When a thermoelectric material having a plate-shape crystalline structure such as Bi—Sb—Te—Se or the like is pressed, its crystalline structure may be arranged such that the first crystal plane P1, which is parallel with the plate shape, may be parallel with a direction perpendicular to a pressing direction. Thus, orientation of the thermoelectric material along the extrusion direction X1 may be increased through the second shaping process. Furthermore, when the cut-off piece 14c or 15c has a smaller length than the inner length of the mold 5, compression and elongation of the thermoelectric material may be allowed so that movement of crystal grain can be allowed. Accordingly, orientation of crystal grain, which is not sufficiently orientated by the extrusion process, is increased so that thermoelectric properties may be increased. For example, the length G of the cut-off piece 14c or 15c disposed in the mold 5 may be 50% to 95% of the width H of an inner space of the mold 5 along a direction parallel with the cut-off piece 14c or 15c.

For example, the second shaped body 16 or 17 may be formed at a room temperature, which may be about 20° C. to about 30° C., and may be pressed by 5 MPa to 500 MPa.

Thereafter, the second shaped body 16 or 17 is sintered (S60). For example, the second shaped body 16 or 17 may be sintered through discharging plasma sintering, hot pressing or the like to effectively increase properties of the thermoelectric material.

For example, referring to FIG. 7, the second shaped body 16 or 17 may be put in a sintering die 18 or 19, which may be a discharging plasma die or a hot pressing die. The second shaped body 16 or 17 may be pressed and sintered at a high temperature to form a sintered body 20 or 21.

For example, a pressing direction and a current-flowing direction of the second shaped body 16 or 17 in the sintering process may be same as the pressing direction X2 in the second shaping process and may be perpendicular to the extrusion direction X1. Preferably, a diameter or a width J or K of the sintering die 18 or 19 may be larger than a diameter or a width H of the second shaped body 16 or 17. Thus, the sintering die 18 or 19 may provide a space that may allow orientation of the second shaped body 16 or 17 to be increased in the sintering process. Thus, abilities of the thermoelectric material may be increased.

For example, the sintering process may be performed at a temperature of 300° C. to 600° C. and at a pressure of 5 MPa to 500 MPa. Furthermore, the sintering process may be performed for 1 minute to 10 hours.

According to an exemplary embodiment of the present invention, orientation of a thermoelectric material may be increased to improve thermoelectric abilities. Furthermore, manufacturing efficiency for a thermoelectric module may be increased.

Hereinafter, a method for manufacturing a thermoelectric module using the thermoelectric material will be more fully explained.

Figure 8:
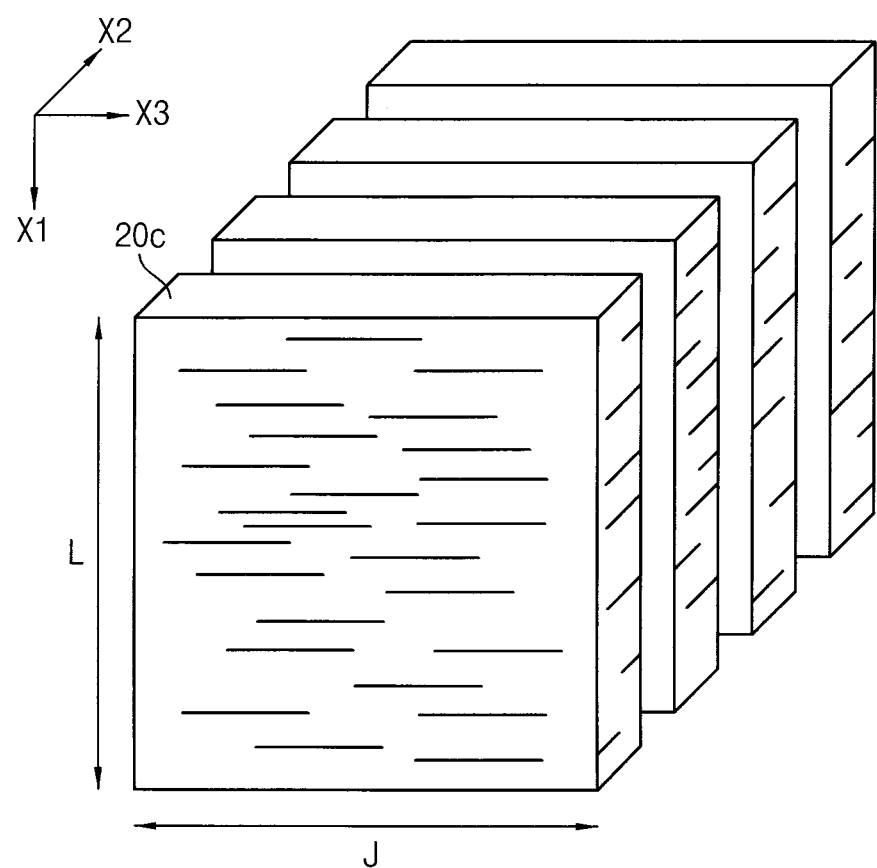
FIG. 8 is a perspective view illustrating firstly cutting a thermoelectric material in a method for manufacturing a thermoelectric module according to an exemplary embodiment of the present invention.
Figure 9:
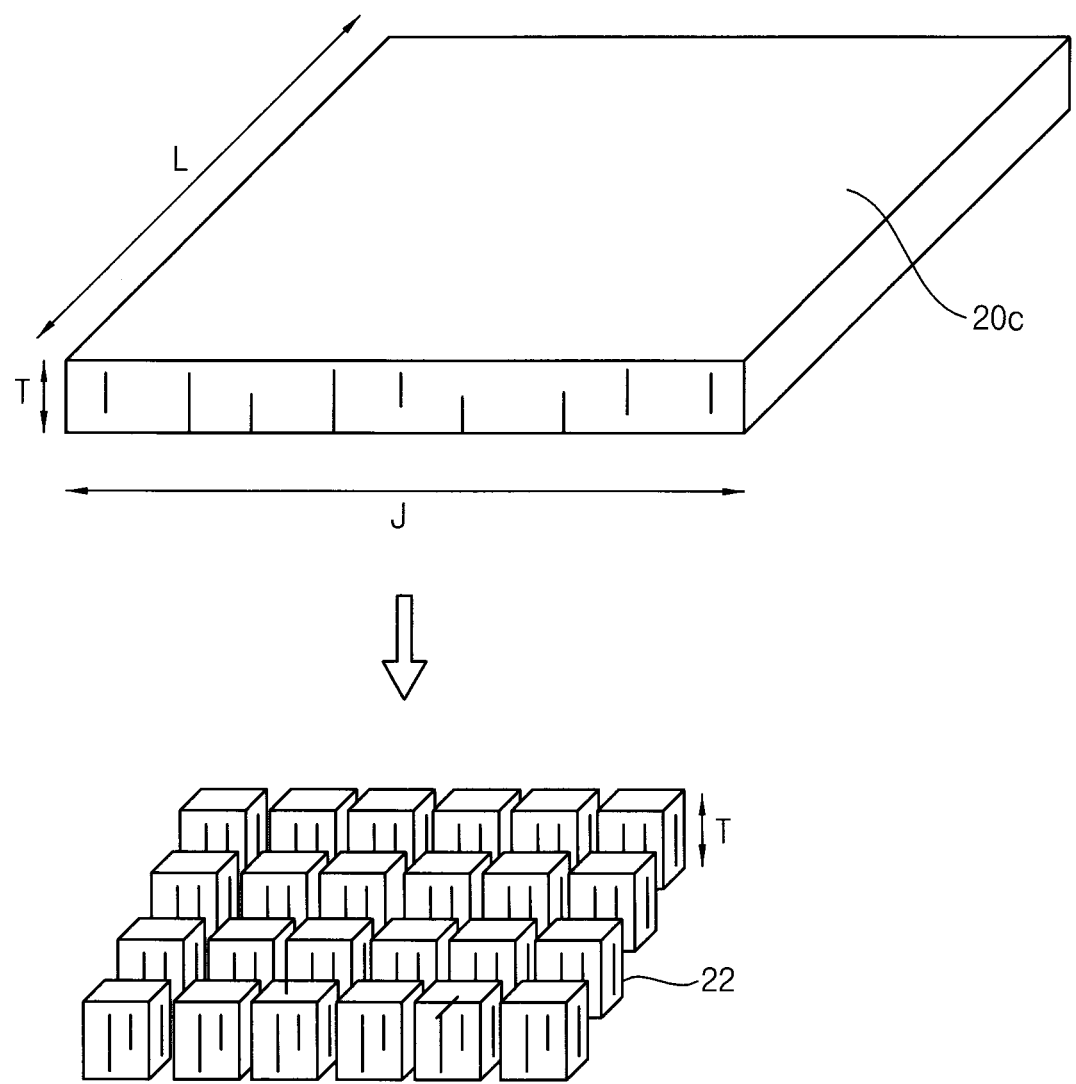
FIG. 9 is a perspective view illustrating secondly cutting the thermoelectric material in a method for manufacturing a thermoelectric module according to an exemplary embodiment of the present invention.
Figure 10:
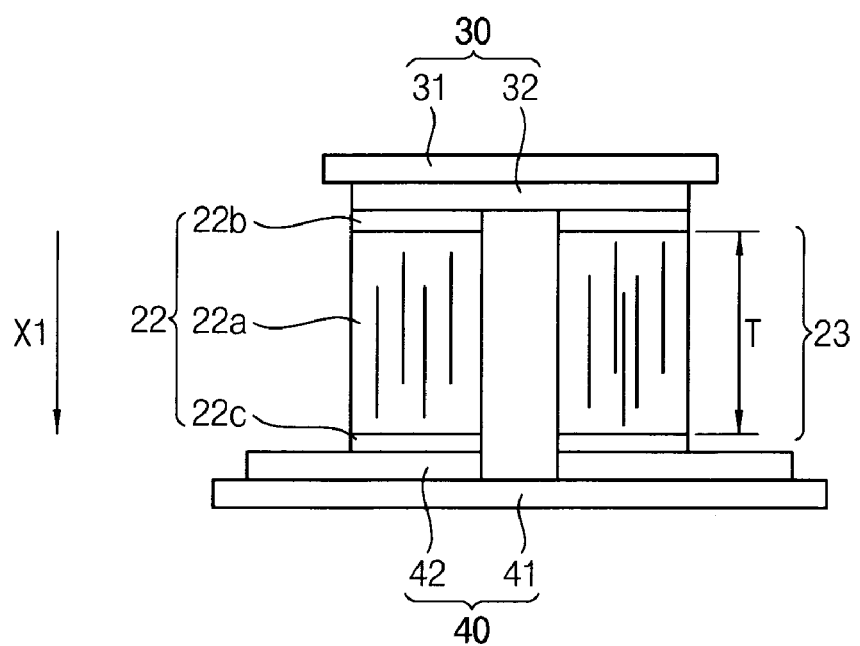
FIG. 10 is a cross-sectional view illustrating a thermoelectric module manufactured by an exemplary embodiment of the present invention.

FIG. 8 is a perspective view illustrating firstly cutting a thermoelectric material in a method for manufacturing a thermoelectric module according to an exemplary embodiment of the present invention. FIG. 9 is a perspective view illustrating secondly cutting the thermoelectric material in a method for manufacturing a thermoelectric module according to an exemplary embodiment of the present invention. FIG. 10 is a cross-sectional view illustrating a thermoelectric module manufactured by an exemplary embodiment of the present invention.

Referring to FIG. 8, a thermoelectric material is firstly cut along a direction. The thermoelectric material may be substantially same as the thermoelectric material that is extruded and orientated along the first direction X1 by the above-explained method. Hereinafter, the thermoelectric material 20 having a quadrangular prism shape will be referred.

For example, the thermoelectric material is cut along a plane perpendicular to the orientation direction X1 to form a mother material 20c having a plate shape. The mother material 20c has orientation along a thickness direction. A thickness T of the mother material 20c may be determined by a cutting distance. A row-directional length J and a column-directional length L may be determined by a size of the thermoelectric material before cut.

In an exemplary embodiment, a metal layer may be formed on at least one of an upper surface and a lower surface of the mother material 20c having a plate shape. The metal layer may include a diffusion-preventing layer that functions to prevent solid phase diffusion of the thermoelectric material. For example, the metal layer may include nickel or nickel alloy, and may be formed through electroplating, electroless plating, thermal evaporation, electrobeam evaporation or the like.

Furthermore, the metal layer may further include a blocking layer disposed on the diffusion-preventing layer and a low resistance metal such as copper, aluminum or the like.

Referring to FIG. 9, the mother material 20c is cut along planes parallel to the orientation direction X1 and perpendicular to each other to form a thermoelectric element unit 22. A thermoelectric material obtained by a conventional method has a small length or a small width along a direction perpendicular to the orientation direction that is same as the extrusion direction. Thus, a size of a cross-section perpendicular to the orientation direction is small. Therefore, the number of thermoelectric element units that may be obtained from the mother material is small, and a size of the thermoelectric element units is small. According to an exemplary embodiment, extruded bodies are stacked to form a second shaped body so that the size of the cross-section perpendicular to the orientation direction can be increased. Therefore, the number of thermoelectric element units that may be obtained from the mother material may be largely increased, and thermoelectric element units having various sizes may be formed.

Thereafter, the thermoelectric element unit 22 is combined with a first substrate 30 and a second substrate 40.

Referring to FIG. 10, the thermoelectric element unit 22 includes a thermoelectric material part 22a, and further includes a first metal layer 22b and a second metal layer 22c that are combined with both ends along the orientation direction X1 of the thermoelectric material part 22a. The first metal layer 22b and the second metal layer 22c may respectively include at least one of the diffusion-preventing layer and the blocking layer.

The first substrate 30 and the second substrate 40 are combined with both ends of the thermoelectric element unit 22, which are opposite to each other along the orientation direction X1 of the thermoelectric material part 22a. For example, the first substrate 30 may be combined with the first metal layer 22b, and the second substrate 40 may be combined with the second metal layer 22c.

The first substrate 30 may include a first base substrate 31 and a first connection line 32. The first base substrate 31 may include an insulation material such as glass, silicon oxide, polymer or the like. The first connection line 32 may be disposed between the first base substrate 31 and the thermoelectric element unit 22. For example, the first connection line 32 may include a conductive material such as a metal. The first connection line 32 may contact the first metal layer 22b to electrically connect the thermoelectric element unit 22 to an adjacent thermoelectric element unit 23. For example, the thermoelectric element unit 22 may be a P-type thermoelectric element, and the adjacent thermoelectric element unit 23 may be an N-type thermoelectric element.

The second substrate 40 may include a second base substrate 41 and a second connection line 42. The second connection line 42 may be disposed between the second base substrate 41 and the thermoelectric element unit 22. The second base substrate 41 and the second connection line 42 may have configurations substantially same as the first base substrate 31 and the first connection line 32. Thus, any duplicated explanation may be omitted.

According to exemplary embodiments of the present invention, efficiency for manufacturing a thermoelectric module may be improved, and a thermoelectric module having a high thermoelectric ability may be obtained.

Hereinafter, a method for manufacturing a thermoelectric material according to the present invention will be explained with reference to particular examples.

EXAMPLE 1

A Bi—Te—Se-based thermoelectric powder having a composition of $Bi_2Te_{2.7}Se_{0.3}$ was pressed to form a first shaped body having a cylindrical shape having a diameter of 20 mm. The first shaped body was extruded through an outlet having a diameter of 3 mm with an extrusion ratio of about 44 to form an extruded body. An extrusion temperature was about 400° C., and an extrusion speed was 5 mm per minute.

The extruded body was cut so that a length was 10 mm Cut-off pieces of the extruded body were stacked to fill a rectangular die having a size of 12×12 mm such that the extrusion direction was perpendicular to a pressing direction. The cut-off pieces of the extruded body were pressed to form a second shaped body. The second shaped body was formed at a room temperature, and pressed by 150 MPa. The second shaped body was sintered by a discharging plasma sintering process to manufacture a thermoelectric material. A sintering temperature was 450° C., and a sintering pressure was 50 MPa.

The thermoelectric material was cut along a direction perpendicular to the pressing direction, and its thermoelectric properties along the extrusion direction were measured as Example 1. For comparison, thermoelectric properties of the extruded body were measured as Comparative Example 1, and thermoelectric properties of a thermoelectric material formed by heating the extruded body at 500° C. for 30 hours were measured as Comparative Example 2.

Figure 11:
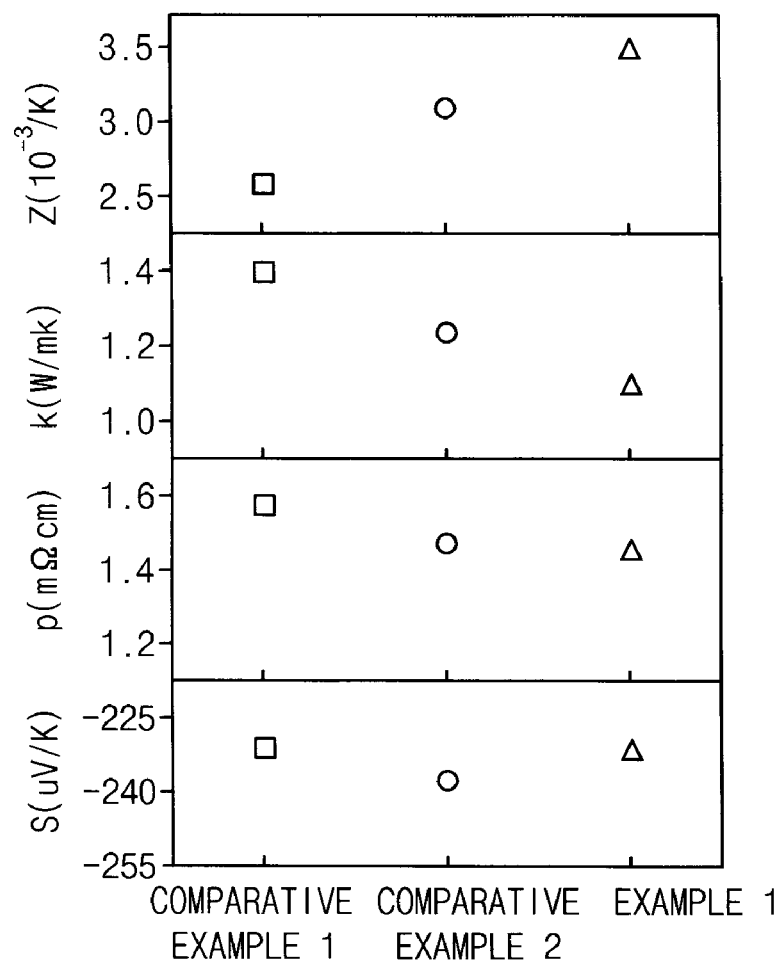
FIG. 11 is a graph showing a thermoelectric figure of merit, a thermal conductivity, an electric resistance and Seebeck coefficient of Example 1, Comparative Example 1 and Comparative Example 2.

FIG. 11 is a graph showing a thermoelectric figure of merit, a thermal conductivity, an electric resistance and Seebeck coefficient of Example 1, Comparative Example 1 and Comparative Example 2. In FIG. 11, Z represents a thermoelectric figure of merit, k represents a thermal conductivity, ρ represents an electric resistance and S represents Seebeck coefficient.

Referring to FIG. 11, it can be noted that the thermoelectric material obtained by stacking and pressing extruded bodies along a direction perpendicular to an extrusion direction to form a second shaped body and sintering the second shaped body can have improved conductivities and thermoelectric properties with compared to the thermoelectric materials obtained by only extrusion as Comparative Example 1 or by sintering after extrusion as Comparative Example 2.

Exemplary embodiments of the present invention may be used for manufacturing a thermoelectric module for small-size generation, cooling or controlling a temperature for various devices or the like.

The foregoing is illustrative and is not to be construed as limiting thereof. Although a few exemplary embodiments have been described, those skilled in the art will readily appreciate that many modifications are possible in the exemplary embodiments without materially departing from the novel teachings, aspects, and advantages of the invention. Accordingly, all such modifications are intended to be included within the scope of this disclosure.

What is claimed is:

1. A method for manufacturing a thermoelectric material, the method comprising:
   forming a first shaped body from a thermoelectric powder, of which a crystal has a layer structure;
   forming an extruded body by extruding the first shaped body;
   forming a plurality of cut-off pieces by cutting the extruded body along a cross-section perpendicular to an extrusion direction; and
   forming a second shaped body by stacking and pressing the cut-off pieces along a direction perpendicular to the extrusion direction such that a thickness of the second shaped body along a pressing direction is greater than a width of the extruded body along a direction perpendicular to the extrusion direction,
   wherein the cut-off pieces are stacked in a mold to form the second shaped body, and a length of the cut-off pieces is 50% to 90% of a width of an inner space of the mold along a longitudinal direction of the cut-off pieces.

2. The method of claim 1, wherein the thermoelectric material includes at least one selected from the group consisting of Bi—Te, Sb—Te, Bi—Te—Se, Bi—Te—Sb and Bi—Sb—Te—Se.

3. The method of claim 1, wherein the extruded body is orientated along a direction parallel with a first crystal plane parallel with the layer structure of the thermoelectric material.

4. The method of claim 1, wherein the second shaped body is formed under a pressure of 5 MPa to 500 MPa.

5. The method of claim 1, further comprising sintering the second shaped body.

6. The method of claim 5, wherein the second shaped body is sintered through a hot pressing process or a discharging plasma process.

7. The method of claim 5, wherein the second shaped body is sintered at a temperature of 300° C. to 600° C.

* * * * *